United States Patent [19]

Posse et al.

[11] Patent Number: 5,001,418

[45] Date of Patent: Mar. 19, 1991

[54] METHOD FOR COMPRESSING DATA-VECTORS FOR A CIRCUIT BOARD TESTING MACHINE

[76] Inventors: Kenneth E. Posse, 3236 Nelson La.; Kevin W. Keirn, 4501 Boardwalk Dr., #H9, both of Fort Collins, Colo. 80525; Michael A. Lassner, 1591 S. Del Norte Ave., Loveland, Colo. 80537; George L. Booth, 1025 Turman Dr., Fort Collins, Colo. 80525

[21] Appl. No.: 449,362

[22] Filed: Dec. 6, 1989

[51] Int. Cl.$^5$ .................................. G01R 31/28
[52] U.S. Cl. .................. 324/73.1; 324/158 R; 371/27
[58] Field of Search ............. 324/158 R, 158 F, 73.1; 371/20, 27, 15, 20.1, 15.1; 358/136; 382/56, 136, 27

[56] References Cited

U.S. PATENT DOCUMENTS

| | | | |
|---|---|---|---|
| 3,584,145 | 6/1971 | Cutler et al. | 358/136 X |
| 4,254,400 | 3/1981 | Yoda et al. | 382/27 X |
| 4,426,731 | 1/1984 | Edlund et al. | 382/56 X |
| 4,439,858 | 3/1984 | Petersen | 371/20 X |
| 4,652,814 | 3/1987 | Groves et al. | 324/73 R |
| 4,698,672 | 10/1987 | Chen et al. | 358/136 X |

OTHER PUBLICATIONS

Michael A. Lassner, Kevin W. Keirn, and Kenneth E. Posse, "Optimization of a Hardware Oriented Test Generation Language," ATE '87 West, Jan. 5-8, 1987, pp. VII-1-VII-15.

Trent Cave, "Compressing Test Patterns to Fit into LSI Testers," Electronics, Oct.-Dec., 1978, vol. 51, pp. 136-140.

*Primary Examiner*—Kenneth Wieder
*Assistant Examiner*—Vinh P. Nguyen
*Attorney, Agent, or Firm*—Christopher J. Byrne

[57] ABSTRACT

Disclosed is a method for compressing sequences of data-vectors, which sequences are to be used for testing circuit boards with the aid of a circuit board testing machine. The method involves an initial compression of the data-vector sequence followed by a so-called K-T transformation of the remaining data-vectors. The initial compression involves eliminating redundant data-vectors from the initial sequence and retaining only the unique data-vectors together with sequencing information indicating where in the initial sequence each unique-data vector occurred. The K-T transformation involves a bitwise logical exclusive-OR operation (XOR) whereby the remaining data-vector sequence is K-T transformed thereby further compressing the sequence without losing any of the original sequence information.

6 Claims, 7 Drawing Sheets

METHOD FOR COMPRESSING DATA-VECTORS FOR A CIRCUIT BOARD TESTING MACHINE

This application is a continuation, of application Ser. No. 07/140,356, filed Jan. 4, 1988, now abandoned.

BACKGROUND OF THE INVENTION

The disclosed invention relates generally to the field of circuit board testing and more specifically to the art of compressing sequences of circuit board data-vectors. Generally, a given circuit board consists of numerous semiconductor chips, such as a microprocessor, memory chips, counter chips, control chips, etc., laid out according to some interactive design. Following design and layout of the circuit board, it is necessary to test the board to ensure that all the chips, as laid out, perform as expected. Testing will involve application of data-vectors to pins of a given chip (or cluster of chips) on the board. A data-vector for a given chip (or cluster of chips) generally consists of a binary word having an "input" portion and an "output" portion. The goal in testing is to determine if the application of the input portion of a data-vector produces an output matching the output portion of the data-vector. If there is a match, the test is successful (pass). Unsuccessful tests (fail) indicate defective board design, defective layout or defective chips. Data-vectors will be supplied by the designer of the circuit board (usually with the aid of a computer-aided-design (CAD) system). The data-vectors will be chosen so as to pinpoint problems on the board, if they exist.

The actual circuit board testing is performed with aid of a circuit board testing machine. (Circuit board testing machines are well known in the prior art. For example, a well known circuit board testing machine is the Hewlett-Packard Company model HP3065 circuit board tester. The HP3065, for instance, has 264 pins which can be simultaneously selectively connected to various pins of a given circuit board for application of data-vectors to the board and the monitoring of board output generated in response.) With the aid of a circuit board tester, whole sequences of data-vectors are applied to the board under test. Such sequences can be quite lengthy, requiring a large amount of memory to store both the data-vector sequences and the output generated by application of the data-vector sequences. In fact, it is not uncommon for data-vector listings to be thousands of data-vectors long where each data-vector is dozens of bits in length. (See, for example, FIG. 2 and accompanying text below). The amount of memory required to store such large amounts of data-vector information is expensive and unwieldy to manage in circuit board testing machines. Thus, manufacturers of circuit board test machines find useful methods for minimizing the amount of memory space necessary for storage and application of data-vector information.

Various data compression techniques are employed by circuit board tester manufacturers to minimize the volume of data-vector information which must actually be stored. One such technique for use with circuit board testers is described in U.S. Pat. No. 4,652,814, issued to Groves, et al. Groves discusses, among other things, a data compression technique involving elimination of redundant data-vectors, that is, retention of only the unique data-vectors in a given data-vector sequence together with sequencing information such that the position of each unique data-vector in the original sequence is "remembered".

SUMMARY OF THE INVENTION

The present invention is a method for "compressing" a sequence of circuit board data-vectors into a smaller sequence of so-called keep-toggle transform vectors (K-T vectors), without losing any of the initial data-vector sequence information. Compression of the data-vector sequence is accomplished in software (See Appendix A) in two passes. The present invention is applied to data-vectors, before the data-vectors are used by the circuit board tester, in order to save memory space, whether that memory is actually in the circuit board tester (such as testhead vector memory) or in secondary storage, such as computer disk space. (Typically, users need to save test data-vectors for testing of different circuits on a given board (or boards) under test on-line, using the computer disk memory. The present invention significantly compresses data-vectors thereby increasing the efficiency with which on-line storage is used.

In the first pass, the data-vector sequence is electronically read and compared and only the unique data-vectors are retained. Although duplicate data-vectors are eliminated from the initial sequence, no initial sequence information is lost in this first pass. The initial sequence is "remembered" by storing only the unique data-vectors together with a corresponding index array indicating where in the initial sequence each unique data-vector occurred. (Generally, it is most likely that the set of unique data-vectors together with an index array indicating the position of each unique data-vector in the initial sequence will consume less memory space than the initial data-vector sequence itself.) If the unique set of data-vectors is greater than a pre-determined threshold value then a second compression pass is executed.

In the second pass, each data-vector in the initial sequence is "transformed" using a so-called K-T transform consisting of a bit-wise exclusive-OR procedure. The K-T transform operation used, as described below in connection with FIG. 4, may actually produce the same K-T transform for two different data-vectors. Thus, the K-T transform set is likely to contain duplicate K-T transforms. The K-T transform set is then read and compared and only the unique K-T transforms are retained. Although duplicate K-T transforms are thus eliminated from the initial K-T transform set, no information is lost. The initial set of K-T transforms is "remembered" by storing only the unique K-T transforms together with a corresponding index array indicating where in the initial sequence of K-T transforms each unique K-T transform occurred. The compressed set of unique K-T transform vectors will usually be smaller than both the initial sequence of data-vectors and the compressed set of unique data-vectors. The net result is a set of unique K-T transform vectors requiring much less memory storage space than the initial sequence of data-vectors but containing all the information in the initial sequence. (See, *Optimization of a Hardware Oriented Test Generation Langauge*, Proceedings ATE '87 West, Jan. 5-8, 1987, MG Expositions Group, Div., Miller-Freeman Publications.) The set of unique K-T transform vectors can then be converted (that is, de-transformed) during execution of the test to recall and apply the original sequence of data-vectors through use of J-K flip-flops and associated circuitry as discussed in connection with FIGS. 5 and 6.

BRIEF DESCRIPTION OF THE DRAWINGS

FIGS. 2A and 2B show sample data-vectors.

Description of the Preferred Embodiment

Figure 1:
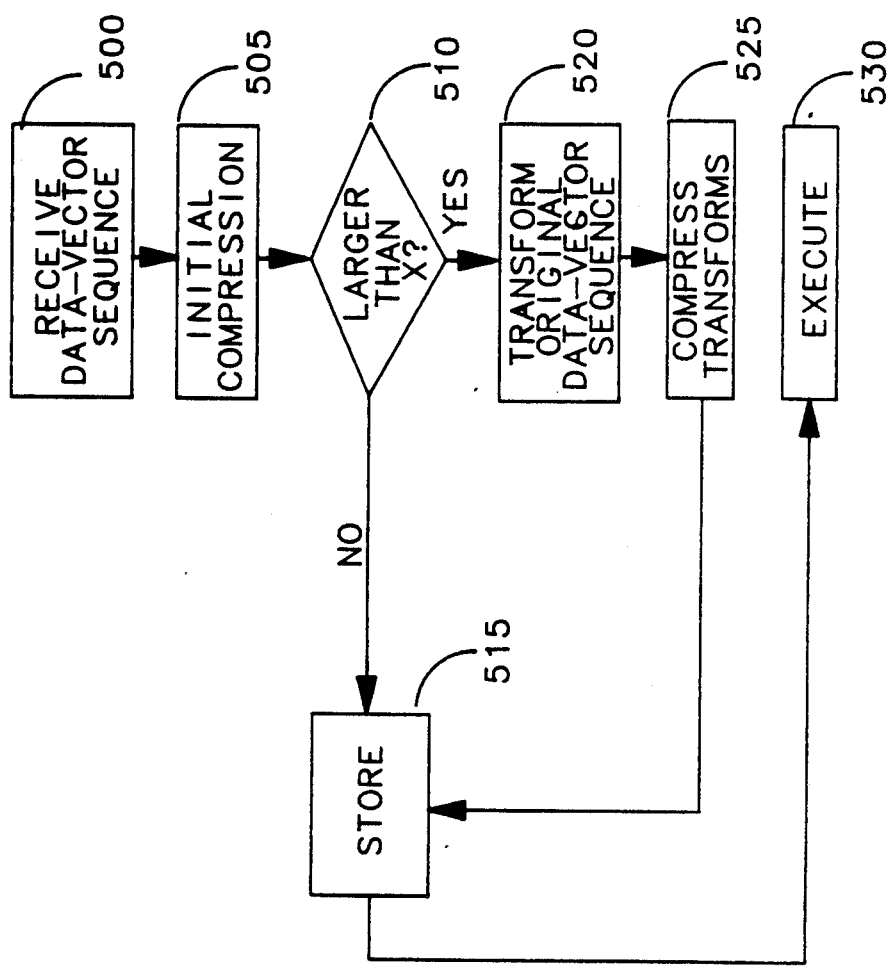
FIG. 1 shows a general level schematic diagram of the method of the present invention.

FIG. 1 shows a general level schematic diagram of the method of the present invention. In the first step 500 a set of data-vectors is received. Data-vectors will be supplied by the designer of the circuit board under test. In step 505 the data-vector sequence is initially compressed by eliminating the non-unique vectors and retaining only the unique vectors together with an index array indicating where in the initial sequence each unique data-vector occurred. In step 510 a check is made to determine if the length of the initially compressed data-vector sequence is below a certain threshold amount. (See process$_{31}$vector, p.11 Appendix A.) In the preferred embodiment of the present invention, the maximum size of data-vector-storage (or K-T transform-vector-storage) memory is 2k-by-264 bits, that is, 2K 264-bit words. This particular limit is essentially arbitrary, but it is motivated by the fact that circuit-boardtesting machine memory is finite and a certain limit must be chosen. In the preferred embodiment of the present invention, one 264-bit word holds just one data-vector (or K-T transform data-vector), even if the data-vector is less than 264 bits. Thus, if the initial sequence of data-vectors is greater than 2K (binary) data-vectors long (that is, X is greater than 2048 in step 510), then the initial sequence undergoes K-T transform step 520, otherwise the initial data-vector sequence is simply stored in step 515. In step 520, each data-vector in the initial data-vector sequence is K-T transformed. (See KT$_{31}$Translate, p. 9 Appendix A.) This set of K-T transform vectors is then compressed in step 525 in the same way that the initial data-vector sequence was compressed in step 505: the K-T transform vector set is compressed by eliminating the non-unique K-T transforms and retaining only the unique K-T transforms together with an index array indicating where in the initial sequence of K-T transforms each unique K-T transform occurred. (See search$_{31}$for$_{31}$vector, p. 7 Appendix A.) The compressed set of K-T transforms is then stored pursuant to step 515. Finally, the stored information, whether it is an initial sequence of data-vectors less than 2K vectors or a set of K-T transform vectors, is executed, that is, applied to the circuit board under test in step 530.

Figure 2A:
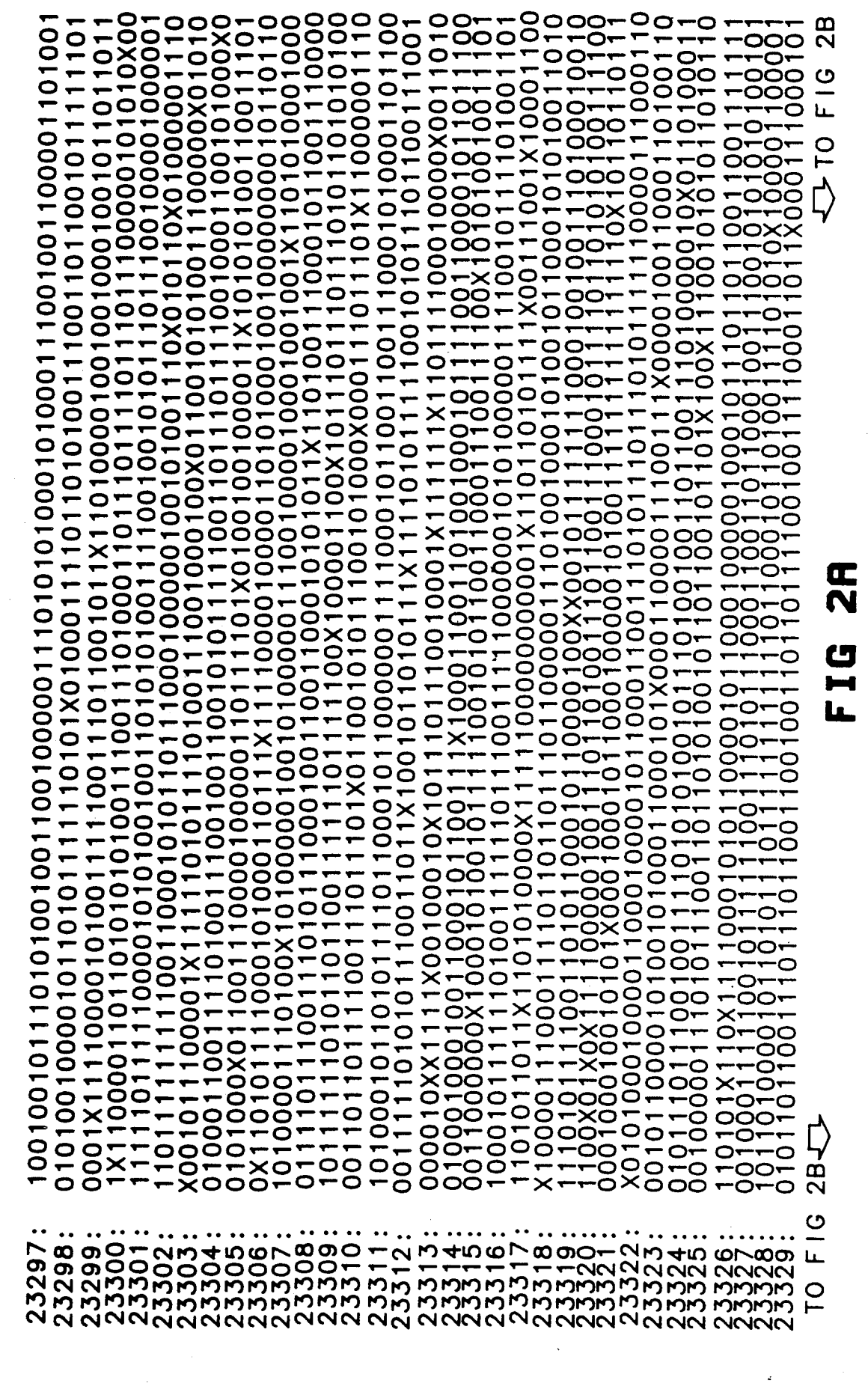
Figure 2B:
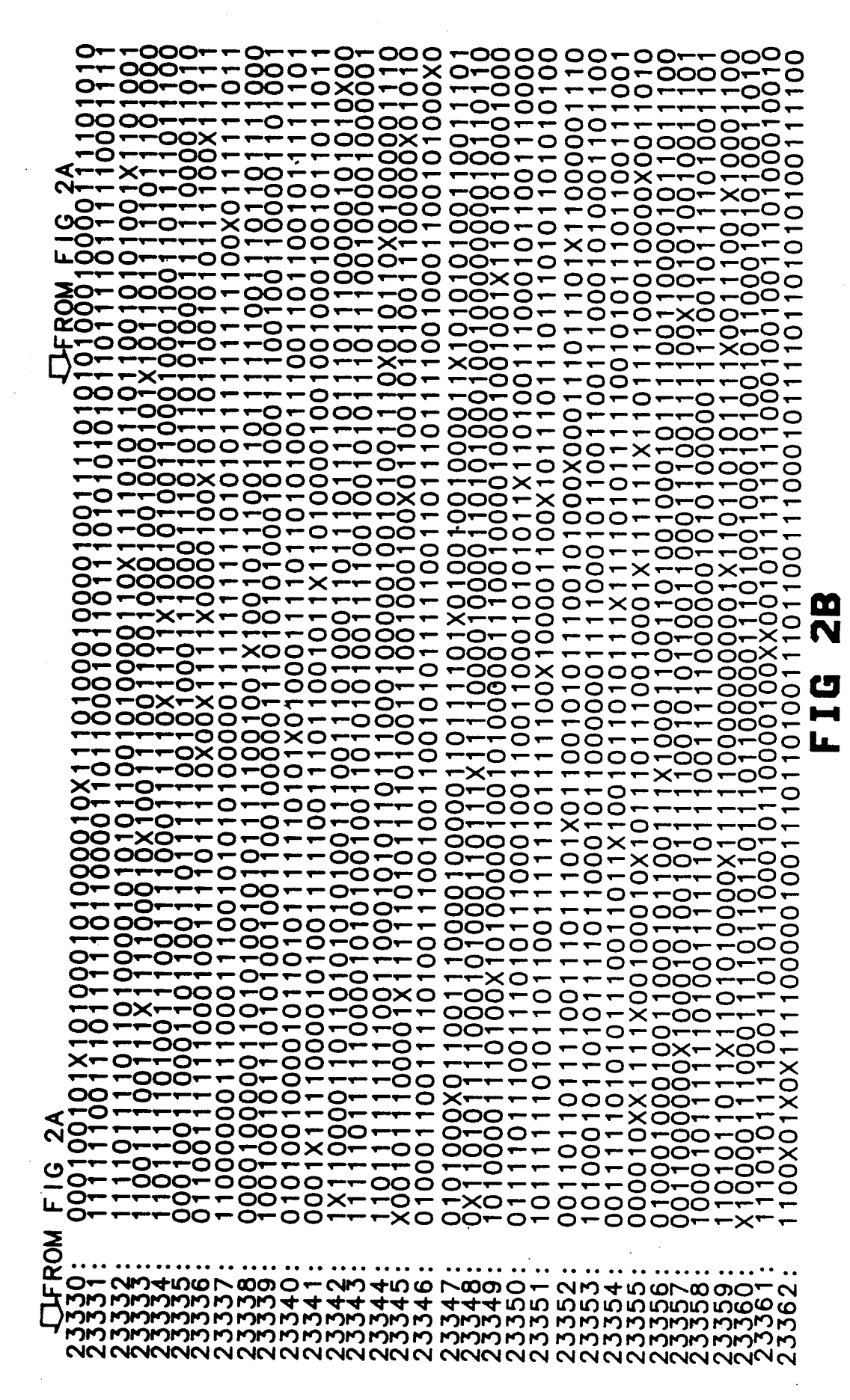

FIG. 2 shows sample data-vectors. As mentioned above, it is not uncommon for data-vector listings to consist of thousands of data vectors where each data-vector consists of dozens of bits. FIG. 2 shows data-vectors 23297 through 23362 from a typical listing of data-vectors. Note that each data-vector in FIG. 2 is more than sixty bits long. The X's in FIG. 2 represent "don't care" bits. Typically, approximately half of each data vector is input information, that is, data to be applied to the circuit board pins under test, and the remaining half is output information, that is, the expected output of the board in response to the input. (For instance, assume that for the data-vectors in FIG. 2, the thirty-two most significant bits of a data-vector are input information and the remaining bits are output information. Starting with data vector 23297, the thirty-two most significant bits of data-vector 23297 would be applied in parallel to thirty-two pins of a given board under test. The expected parallel output from the thirty-two pins in response to the input would be the remaining bits of data-vector 23297.) As can be seen from FIG. 2, the initial data-vector sequence represents an enormous amount of information. One can easily imagine the difficulty of storing and manipulating over twenty-thousand lines of data-vectors such as those represented in FIG. 2.

Figure 3:
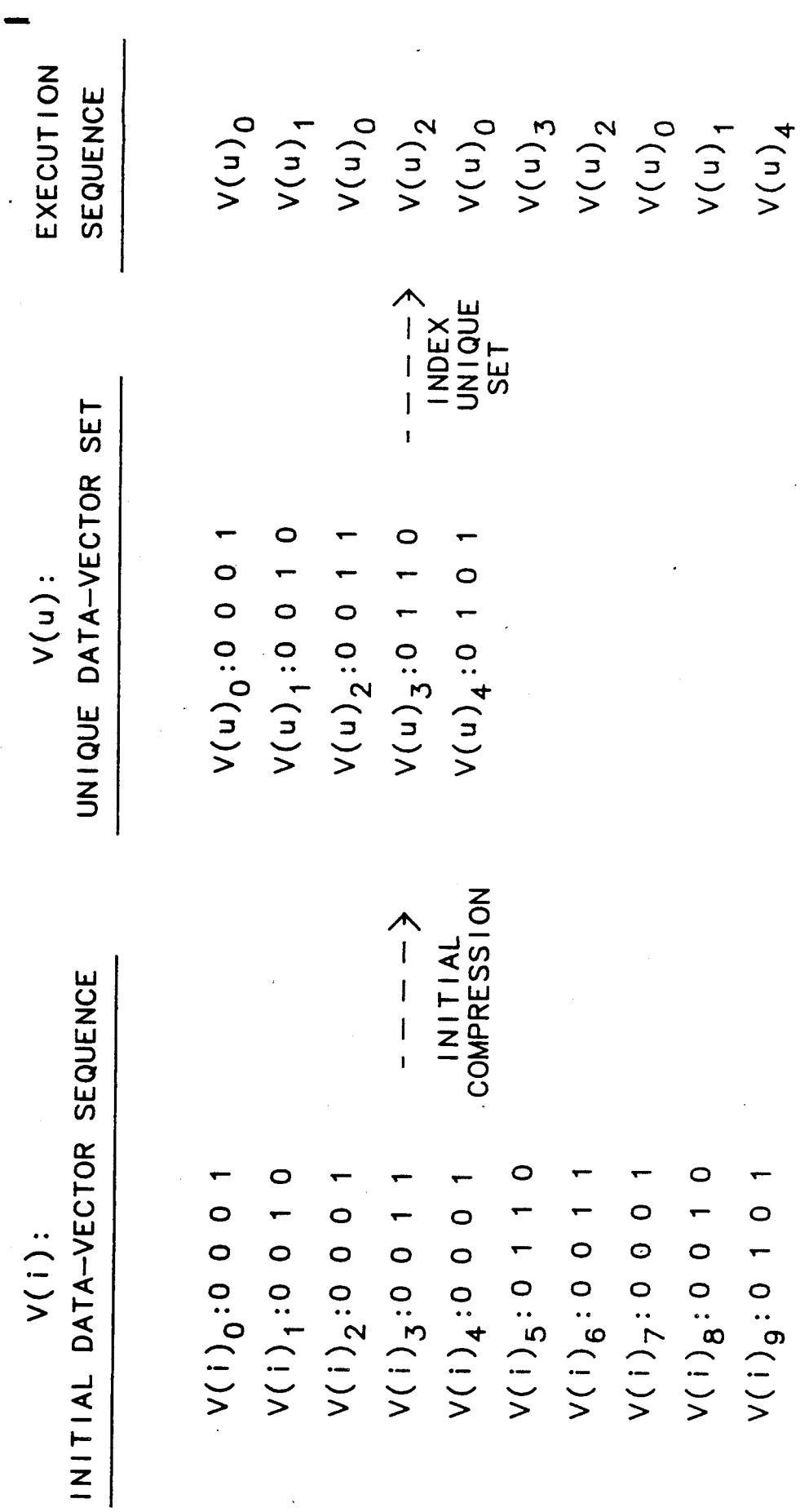
FIG. 3 shows a representative example illustrating execution of the initial compression step 505 of FIG. 1.

FIG. 3 shows a representative example illustrating execution of the initial compression step 505 of FIG. 1. As noted in connection with FIG. 1, the first step in the method of the present invention is an initial compression (step 505) of the initial data-vector sequence involving elimination of the redundant data-vectors. (In FIG. 3, 4-bit data-vectors are used for ease of explanation, although the teaching of FIG. 3 obviously applies to data-vectors of any bit-length.) In the initial data-vector sequence, $V(i)_0$ through $V(i)_9$, there are five unique data-vectors. These five unique data-vectors, $V(u)_0$ through $V(u)_4$, are shown in the adjacent column. Execution of data-vectors $V(u)_0$ through $V(u)_4$ in the proper sequence (which sequence is listed in the right-hand-most column of FIG. 3) is equivalent to executing the original data-vector sequence $V(i)_0$ through $V(i)_9$. Techniques for filtering for unique data-vectors, storing the unique vectors, and sequencing execution of the unique vectors to recall the original sequence are well known in the prior art. See U.S. Pat. No. 4,652,814 (in particular column 7). See also, Cave, T., *Compressing Test Patterns to Fit into LSI Testers*, Electronics, Oct. 12, 1978, pp. 136–140. See also, Lassner, et al., *Optimization of a Hardware Oriented Test Generation Langauge*, Proceedings ATE '87 West, Jan.5–8, 1987, MG Expositions Group, Div., Miller-Freeman Publications.)

Figure 4:
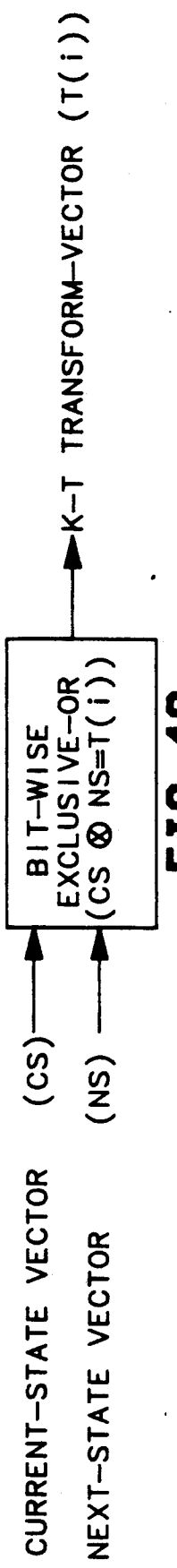
FIG. 4A shows a schematic explanation of step 520 of FIG. 1.
FIG. 4B shows a representative example illustrating execution of steps 520, 525 and 515 of FIG. 1.
FIG. 4C shows a formalistic representation of FIG. 4B.

FIG. 4A shows a schematic explanation of step 520 of FIG. 1. In the preferred embodiment of the present invention, step 520 is executed only if the list of unique data-vectors, following initial compression, is greater than 2K, that is, there are more than 2048 unique data-vectors. If so, each data-vector in the initial sequence undergoes a so-called K-T transform procedure. The K-T transform consist of a bit-wise exclusiveORing of each data-vector (current$_{31}$state vector) in the initial sequence with the data-vector immediately following (next$_{31}$state vector) in the sequence. The bit-wise exclusive-OR operation (denoted as XOR hereinafter) is denoted in FIG. 4 by a circle with an "X" through it. In the preferred embodiment of the present invention, the first data-vector in the initial sequence is always XORed with the zero-vector, that is, a vector having 0s in all bit positions. Thus, the zero vector may be thought of as data-vector $V(i)_{31\ 1}$, while the data-vectors in the initial sequence may be thought of as data-vectors $V(i)_0$ through $V(i)_n$. Thus, $V(i)_{31\ 1}$ is XORed with $V(i)_0$ to produce K-T transform vector $T(i)_0$. Likewise, $V(i)_0$ is XORed with $V(i)_l$ to produce K-T transform vector $T(i)_l$. Thus:

$$V(i)_{-1} \text{ XOR } V(i)_0 = T(i)_0;$$
$$V(i)_0 \text{ XOR } V(i)_1 = T(i)_1;$$
$$V(i)_1 \text{ XOR } V(i)_2 = T(i)_2;$$
$$V(i)_2 \text{ XOR } V(i)_3 = T(i)_3;$$

$$V(i)_{n-1} \text{ XOR } V(i)_n = T(i)_n.$$

It is also proper to think of data-vectors as representing a "state" of the board under test. Thus, if $V(i)_k$ is the current-state (CS) of the machine, then $V(i)_{k+1}$ is the next-state (NS).

FIG. 4B shows a representative example illustrating execution of steps 520, 525 and 515 of FIG. 1 using the principles discussed in connection with FIG. 4A above. Assuming that $V(i)_{31\ 1}=0000$, we see from FIG. 4B that:

$$V(i)_{-1} \text{ XOR } V(i)_0 = T(i)_0;$$
$$V(i)_0 \text{ XOR } V(i)_1 = T(i)_1;$$
$$V(i)_1 \text{ XOR } V(i)_2 = T(i)_2;$$
$$V(i)_2 \text{ XOR } V(i)_3 = T(i)_3; \text{ and}$$
$$V(i)_3 \text{ XOR } V(i)_4 = T(i)_4.$$

FIG. 4B also shows that it is a property of the K-T transform that a set of unique data-vectors, that is $V(u)_0$ through $V(u)_4$, can produce redundant K-T transforms: note in FIG. 4B that $T(i)_0 = T(i)_2$ and that $T(i)_l = T(i)_4$. As discussed in connection with FIG. 3 in the case of data-vectors, the initial K-T transform set, that is, $T(i)_0$ through $T(i)_n$, may be compressed by storing only the unique K-T transforms together with sequencing information indicating where in the initial K-T transform sequence each unique K-T transforms occurred. (See Build31Sequence31RAM, p. 8 Appendix A.) Thus the initial sequence of K-T transforms can be compressed into a smaller sequence of unique K-T transforms, that is, $T(u)_0$ through $T(u)_2$. Likewise as discussed in connection with FIG. 3 in the case of data-vectors, execution of data-vectors $T(u)_0$ through $T(u)_2$ in the proper sequence (which sequence is listed in the right-handmost column of FIG. 4B) is equivalent to executing the initial K-T transform sequence $T(i)_0$ through $T(i)_4$.

FIG. 4C shows a formalistic representation of FIG. 4B, using current31state (CS) and next31state (NS) symbolism as discussed above in connection with FIG. 4A. Note in FIG. 4C that, in accordance with preferred embodiment of the present invention, the initial current31state, $CS_0$, is the zero vector.

Figure 5:
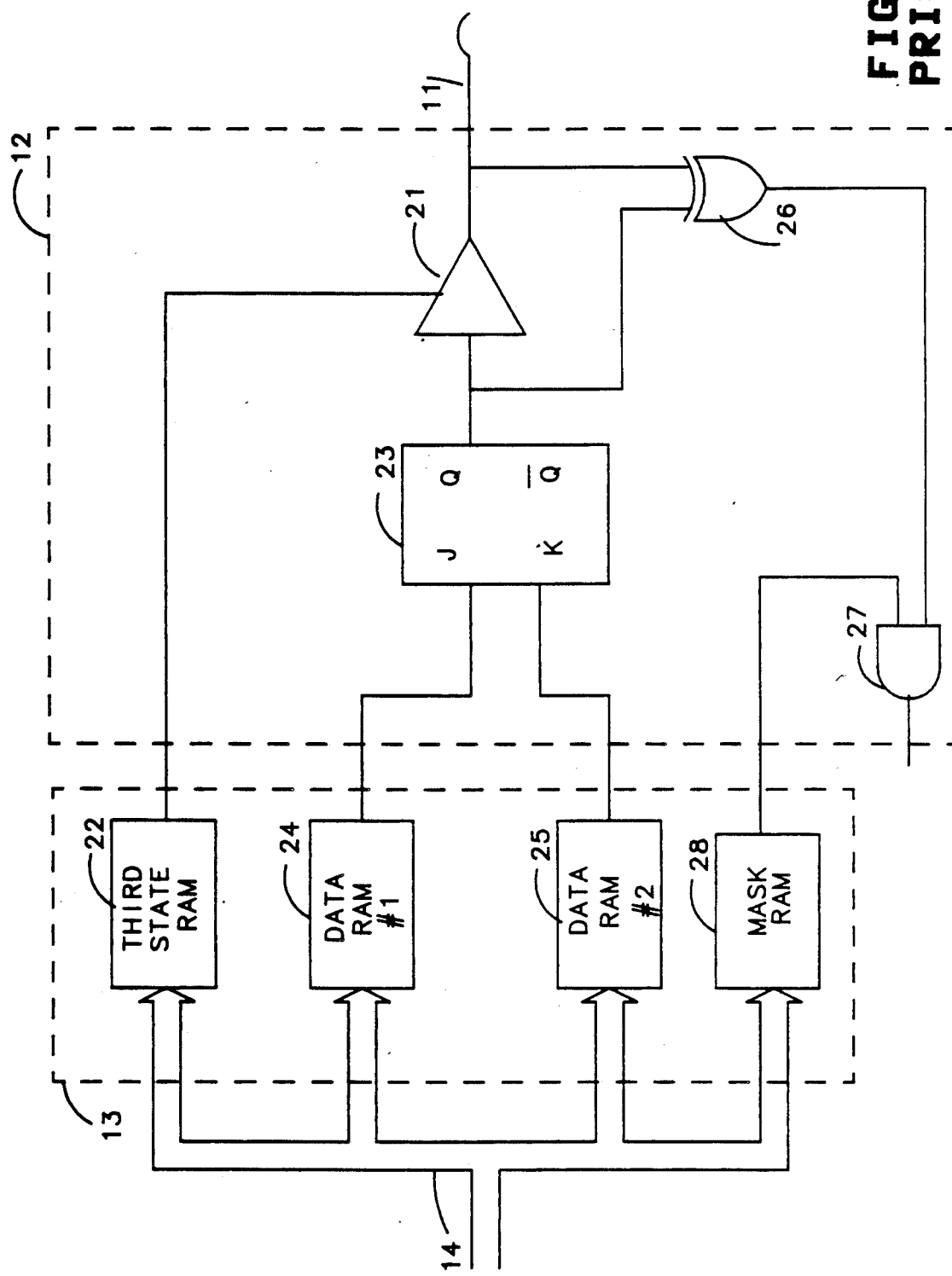
FIG. 5 is a schematic diagram showing hardware which could be used to implement step 530 of FIG. 1.

It should be noted in connection with FIG. 4 that there are certain conditions under which K-T transformation is illegal, so to speak. Whenever a given data-vector has more than one next31state, the transformation is illegal and the data-vector itself, not a its K-T transformation, must be stored. Cases where a given data-vector will have more than one next31state include repeat loops and subroutine calls. See U.S. Pat. No. 4,652,814 (in particular column 7). See also, Cave, T., *Compressing Test Patterns to Fit into LSI Testers*, Electronics, Oct. 12, 1978, pp. 136–140. See also, Lassner, et al., *Optimization of a Hardware Oriented Test Generation Langauge*, Proceedings ATE '87 West, Jan. 5–8, 1987, MG Expositions Group, Div., Miller-Freeman Publications.) FIG. 5 is a schematic diagram showing hardware which could be used to implement step 530 of FIG. 1.

FIG. 5 shows circuitry which was described in detail in U.S. Pat. NO. 4,652,814. Pin 11 represents one of a number of circuit board tester machine pins which are used to energize a board under test. In typical circuit board testers, such as the HP3065 which has 264 pins, each such pin 11 is used to apply a single input bit of a given data-vector to a given pin on a board under test and to monitor the board pin for output to be compared with the corresponding output bit of the data-vector. Thus, pin 11 is bi-directional, that is, it may deliver input information from the circuit tester machine or receive output information from the board under test. As discussed in U.S. Pat. No. 4,652,814 column 5, pin driver circuit 12 (which consists of J-K flip-flop 23, driver 21, exclusive-OR gate 26 and AND gate 27) and local test data RAM 13 (which comprises the combination of RAMs 22, 24, 25 and 28) cooperate to determine which of two modes data is to be utilized. In the terminology of U.S. Pat. No. 4,652,814, the two modes are the raw data mode and the derivative data mode. In the raw data mode, either a 1 or a 0 is present at the input to J-K flip-flop 23. (In the raw data mode, the data presented indicates whether the signal on the pin is to be driven high (1) or low (0). It is by definition a function of the J-K flip-flop that in response to a 1 the output Q of a J-K flip-flop is low and in response to a 0 the output is high. In the derivative data mode, either a "keep" ("K") or a "toggle" ("T") is provided to the input of J-K 23. (In the derivative data mode, the data presented indicates whether the signal on the pin is to be kept in its present state (keep) or toggled to its complementary state (toggle)). In the case of a K, a 0 is presented to both the J-input and the K-input of J-K 23, that is, $K=00$. In the case of a T, a 0 is presented to the J-input and a 1 is presented to the K-input of J-K 23, that is $T=11$. Thus, in response to a K, the state of the J-K 23 is unchanged whereas in response to a T the state of the J-K 23 is complemented (that is, toggled). The data in RAMS 24 and 25 of test data RAM 13 determine whether a 0, 1, K or T is presented to J-K 23. In the preferred embodiment of the present invention, it is assumed (as taught in U.S. Pat. No. 4,652,814) that each bit of a data-vector (whether stored as itself or as its representative K-T transformation) corresponds to a single pin 11 having a corresponding J-K 23. Thus, the current31state of the data-vector sequence can be stored in a parallel bank of J-K 23 flip-flips. (Such a parallel bank of J-K 23 flip-flops is represented schematically in FIG. 6.)

Figure 6:
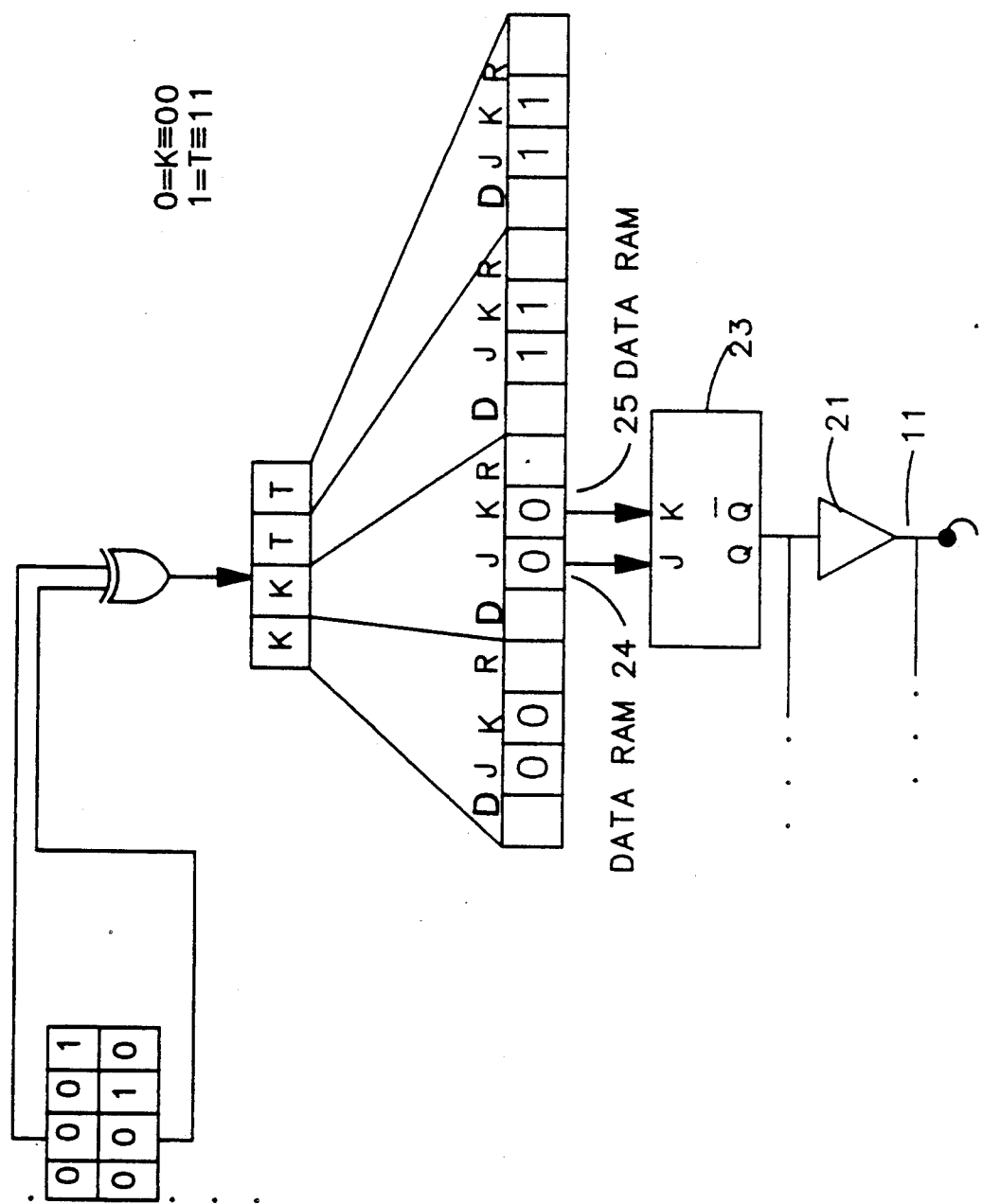
FIG. 6 further illustrates steps 520 through 530 of FIG. 1.

FIG. 6 further illustrates steps 520 through 530 of FIG. 1. FIG. 6 shows schematically that each pin 11 of the multipin circuit board tester has a corresponding local test data RAM 13 (comprising data RAMs 24 and 25) and a pin driver circuit 13 (comprising J-K 23 and driver 21, among other things). FIG. 6 also reveals the origin of the name for the so-called K-T transformation. In performing the bit-wise XOR operation on a sequence of data-vectors, the resulting K-T transforms may be represented by the letters K and T where K denotes 0 and T denotes 1. For example, assume as follows:

$$V(i)_n = 0001;$$

and $$V(i)_{n+1} = 0010,$$

where $V(i)_n$ is the current₃₁state of the data-vector sequence (that is, $V(i)_n = CS_n$) and $V(i)_{n+1}$ is the next₃₁state of the data-vector sequence (that is, $CS_{n+1} = NS_n$) and the resulting K-T transform is denoted by $T_n$. Thus given that "K" denotes "0" and "T" denotes "1", we have:

$$CS_n \text{ XOR } NS_n = T_n = KKTT = 0011;$$

or equivalently:

$$0001 \text{ XOR } 0010 = 0011 = KKTT.$$

In FIG. 6, a symbolic exclusive-OR gate is shown to represent that each bit of a given data-vector in the data-vector sequence (current₃₁state $CS_n$) is combined in an exclusive-OR operation with the corresponding bit of the next data-vector in the sequence (next₃₁state $NS_n$) to produce a resultant K-T transform vector $T_n$. This bit-wise exclusive-ORing of data-vectors results in a smaller list of representative K-T transforms which can completely recall the original data-vector sequences, as described above in connection with FIG. 4. In the preferred embodiment of the present invention, it is assumed (as taught in U.S. Pat. No. 4,652,814) that each bit of a data-vector (whether stored as itself or as its representative K-T transformation) corresponds to a single pin 11 having a corresponding J-K 23. Thus, the current₃₁state of the data-vector sequence can be stored in a parallel bank of J-K 23 flip-flips. (Such a parallel bank of J-K 23 flip-flops is represented schematically in FIG. 6.) Moreover, since a "keep" (that is, K=00) will preserve the state of J-K 23 while a "toggle" (that is, T=11) will toggle the state of J-K 23, the next₃₁state of the data-vector sequence can be loaded into the bank of J-K 23 flip-flops by the appropriate parallel presentation of "keeps" and "toggles". Such an appropriate arrangement of "keeps" and "toggles" is inherent in the stored executable sequence of K-T transforms as derived from the initial data-vector sequence, as discussed in connection with FIG. 4. For each K-T transform, such as those discussed in FIG. 4, let the 0s be represented by Ks and the 1s be represented by Ts. Each bit (that is each K or T) of a given transform is then expandable into four bits to accommodate the circuitry of FIG. 5. (See JK₃₁Analysis p. 3, Appendix A.) In the 1-to-4 bit expansion, the four bits corresponding to the 4-bit expansion of a given transform bit can be stored in parallel locations in RAMS 22, 24, 25 and 28 of FIG. 5. As shown in FIG. 6, the middle two bits of the 4-bit expansion represent the "keep" or "toggle" information which is presented to J-K 23. As shown in FIG. 6, a K is converted to 00 while a T is converted to 11. This conversion is consistent with the "keep" (that is, K) and "toggle" (that is, T) convention discussed above in connection with FIG. 5.

Thus, the original data-vector sequence can be compressed by eliminating redundant data-vectors and performing K-T transformations on the remaining data-vectors. The K-T transforms can also be compressed by eliminating redundant transforms. The non-redundant K-T transforms (together with the sequencing information necessary to recall the original sequence), then undergo 1-to-4 bit expansion as discussed above such that Ks are converted to 00 and Ts to 11. The converted Ks and Ts are then stored in parallel locations in RAMs 24 and 25.

We claim:

1. A method for compressing a predetermined set of binary data-vectors, said data-vectors to be used as executable input information in circuit board testing, said method comprising the steps of:
    (a) electronically reading said set;
    (b) identifying the unique data-vectors within said set;
    (c) creating a first subset of said set consisting of said unique data-vectors;
    (d) testing said first subset to determine if the number of unique data-vectors in said first subset exceeds a predetermined value;
    (e) jumping to step h if said number exceeds said value;
    (f) storing said first subset;
    (g) executing said first subset and exiting said method;
    (h) performing a K-T transformation operation on said first subset to produce a second subset of K-T transform vectors;
    (i) retaining the unique transform vectors within said second subset;
    (j) creating a third subset of second subset consisting of said unique transform vectors and index information indicating the position in said second subset of said unique transformvectors;
    (k) storing said third subset;
    (l) executing said third subset and exiting said method.

2. A method, as in claim 1, wherein said K-T transformation comprises the step of applying a bit-wise logical exclusive-OR gating operation to the data-vectors of said first subset.

3. An improved method for compressing a previously created first subset of a set of binary data-vectors, wherein said data-vectors are to be used as executable input information in circuit board testing and wherein said first subset is created from the unique data-vectors in said set of binary data-vectors, said improvement comprising the steps of:
    transforming said data-vectors in said first subset by a K-T transformation operation to produce a second subset comprising K-T transform vectors;
    identifying the unique K-T transform vectors within said second subset; and
    retaining the unique K-T transform vectors within said second subset, thereby creating a third subset of said unique K-T transform vectors.

4. The method of claim 3, wherein said step of retaining the unique K-T transform vectors within said second subset comprises the step of determining sequencing information relating to the sequence of said unique K-T transform vectors and including said sequencing information in said third subset.

5. The method of claim 3, further comprising the steps of determining the number of data-vectors in said first subset, comparing such data-vector number to a predetermined number and eliminating the steps of transforming to form a second subset, identifying unique transforms within the second subset and forming a third subset, if said comparison indicates that said data-vector number does not exceed said predetermined number.

6. The method of claim 3, wherein said step of transforming said data-vectors in said first subset by a K-T transformation operation comprises the step of applying the data-vectors to an exclusive OR gate.

* * * * *